(12) United States Patent
Son et al.

(10) Patent No.: US 9,112,180 B2
(45) Date of Patent: Aug. 18, 2015

(54) ORGANIC LIGHT EMITTING DIODE DISPLAY AND MANUFACTURING METHOD THEREOF

(75) Inventors: Jung-Hyun Son, Yongin (KR); Hoon Kim, Yongin (KR); Kie Hyun Nam, Yongin (KR)

(73) Assignees: Samsung Display Co., Ltd., Yongin-si (KR); Youlchon Chemical Co., Ltd., Seoul (KR)

(*) Notice: Subject to any disclaimer, the term of this patent is extended or adjusted under 35 U.S.C. 154(b) by 440 days.

(21) Appl. No.: 13/476,976

(22) Filed: May 21, 2012

(65) Prior Publication Data

US 2012/0326194 A1  Dec. 27, 2012

(30) Foreign Application Priority Data

Jun. 21, 2011 (KR) .................. 10-2011-0060249

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC ........ *H01L 51/5253* (2013.01); *H01L 51/5259* (2013.01)

(58) Field of Classification Search
CPC .................. H01L 51/5253; H01L 51/5259
USPC ............ 257/40, 52, 53, 57, 59, 64–75, 184, 257/192, 291, E51.005, E21.053, E27.001, 257/E27.13, E27.111, E27.116, E27.117; 438/28–30, 34, 66, 69, 75, 82, 96, 99, 438/128, 135; 349/43, 48, 56, 58, 69, 153, 349/155, 156, FOR. 124
See application file for complete search history.

(56) References Cited

U.S. PATENT DOCUMENTS

2005/0194896 A1* 9/2005 Sugita et al. .................. 313/506
2011/0006316 A1* 1/2011 Ing et al. ......................... 257/89

FOREIGN PATENT DOCUMENTS

| JP | 2003-229248 A | 8/2003 |
| KR | 10-2002-0065125 A | 8/2002 |
| KR | 10-2004-0105960 | 12/2004 |
| KR | 10-0671480 | 1/2007 |
| KR | 10-2009-0073362 | 7/2009 |
| KR | 10-2009-0098962 | 9/2009 |

OTHER PUBLICATIONS

Korean Patent Abstracts, Publication No. 10-20000071821 A dated Nov. 25, 2000 for corresponding Koren Patent 10-0671480 listed above.

* cited by examiner

*Primary Examiner* — Meiya Li
(74) *Attorney, Agent, or Firm* — Christie, Parker & Hale, LLP

(57) ABSTRACT

An OLED display according to an exemplary embodiment includes: a substrate; an organic light emitting diode formed on the substrate; an overcoat covering the organic light emitting diode; and a patterned metal sheet attached on the overcoat and having a plurality of protrusion and depression portions. A plurality of protrusions may be formed in a bottom surface of the patterned metal sheet where the protrusion and depression portions of the patterned metal sheet and the overcoat face each other.

12 Claims, 6 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2011-0060249 filed in the Korean Intellectual Property Office on Jun. 21, 2011, the entire contents of which are incorporated herein by reference.

BACKGROUND

1. Technical Field

The described technology relates generally to an organic light emitting diode (OLED) display and a manufacturing method thereof.

2. Description of Related Art

Unlike the liquid crystal display (LCD), an organic light emitting diode (OLED) display does not require a separate light source, thereby making it possible to be implemented as a slim and lightweight display. Furthermore, as the organic light emitting diode display has high quality characteristics such as lower power consumption, high luminance, and short response time, it has been spotlighted as a next generation display device.

The OLED includes a plurality of light emitting diodes, each having a hole injection electrode, an organic emission layer, and an electron injection electrode. Electrons and holes are combined with each other in the organic emissive layer, thereby generating excitons. When the excitons shift from the excited state to the ground state, energy is generated, thereby emitting light, and images are displayed from the emitted light.

However, because the organic emission layer is sensitive to external factors such as moisture or oxygen, when the organic emission layer is exposed to moisture and oxygen, the quality of the OLED display deteriorates. Therefore, in order to protect the OLED and to prevent moisture or oxygen from penetrating the organic emission layer, an encapsulation substrate is sealed and adhered through an additional sealing process, a thick protective layer is formed on the OLED, or an inorganic layer and an organic layer are alternately layered (more than one layer) to cover the display area with a thin film encapsulation layer.

The above information disclosed in this Background section is presented solely to enhance the understanding of the background of the described technology, and therefore may contain information that is not prior art or that is already known in this country to a person of ordinary skill in the art.

SUMMARY OF THE INVENTION

The described technology has been made in an effort to provide an organic light emitting diode (OLED) display having organic light emitting diodes with improved life-span by completely blocking the permeation of external moisture by improving adhesion between an overcoat and protrusions and depressions in the metal sheet.

An OLED display according to an exemplary embodiment includes: a substrate; an organic light emitting diode formed on the substrate; an overcoat covering the organic light emitting diode; and a patterned metal sheet having a plurality of protrusions and depressions, the patterned metal sheet being attached on the overcoat. A plurality of protrusions may be formed in a bottom surface of the patterned metal sheet, and the protrusions and depressions of the patterned metal sheet and the overcoat face each other.

The protrusions and depressions may include alternating convex portions and recess portions.

The height of the convex portion of the protrusions and depressions may be 10% to 100% of the thickness of the patterned metal sheet.

Silicon oxide particles may be attached to the bottom surface of the protrusions and depressions.

A ratio of the silicon oxide particles with respect to the protrusions may be 1 wt % to 20 wt %.

The thin film encapsulation layer may further include an organic sheet attached to an upper surface of the protrusions of the patterned metal sheet, and a flat metal sheet attached to an upper surface of the organic sheet.

The organic sheet and the flat metal sheet may be alternately layered, and thus, a plurality of each of these sheets may be provided.

The patterned metal sheet and its protrusion may be formed of the same material.

The overcoat and the organic sheet may include an organic layer and an adhesive layer formed on the organic layer.

The adhesive layer may be formed by sequentially layering a first filling adhesive layer, a moisture-absorbing layer, and a second filling adhesive layer.

The moisture-absorbing layer may include at least one moisture-absorbing material selected from silica gel ($SiO_2 \circ H_2O$), alumino-silicate beads, montmorillonite, zeolite ($Na_{12}AlO_3SiO_2 \circ 12H_2O$) as a molecular sieve, activated carbon, alkali metal oxide, alkaline earth metal oxide, metal sulfate, metal halide, and metal per chlorate.

The first filling adhesive layer and the second filling adhesive layer may respectively include at least one filling material selected from talc, silica, magnesium oxide, mica, montmorillonite, alumina, graphite, beryllium oxide, aluminum nitride, silicon carbide, mullite, and silicon.

The adhesive layer may include a thermosetting resin or a photo-curable resin.

All of the first filling adhesive layer, the moisture-absorbing layer, and the second filling-adhesive layer may include homogeneous thermosetting resins or photo-curable resins such that the adhesive layers are formed as one sheet by not forming interlayer interfaces therebetween.

In addition, a manufacturing method of an OLED display according to another exemplary embodiment includes: forming an organic light emitting diode and an overcoat on a substrate; manufacturing a patterned metal sheet having portions with protrusions; and forming a thin film encapsulation layer by attaching the patterned metal sheet on the overcoat.

The manufacturing of the patterned metal sheet may include: forming the patterned metal sheet by forming protrusions and depressions in a metal sheet; and forming the protrusions and depressions at a surface of the patterned metal sheet by surface-processing the patterned metal sheet.

The manufacturing method of the OLED may further include attaching oxide silicon particles to the protrusion and depression portions.

The forming of the overcoat may include forming an organic layer on the organic light emitting diode and sequentially forming a first filling adhesive layer, a moisture-absorbing layer, and a second filling adhesive layer on the organic layer.

The forming of the adhesive layer may be performed using at least one process selected from a roll-to-roll process, a roll-to-glass process, a press process, and a diaphragm process.

The forming of the thin film encapsulation layer includes attaching the patterned metal sheet on the overcoat by performing a lamination process, a press process, or a diaphragm process.

The forming of the thin film encapsulation layer further includes: attaching an organic sheet on an upper surface of the patterned metal sheet; and attaching a flat metal sheet on an upper surface of the organic sheet.

The OLED display according to exemplary embodiments has a thin film encapsulation layer including the patterned metal sheet (having the protrusion and depression portions) on the overcoat formed in the organic layer so that the surface area of the patterned metal sheet can be increased, thereby forming many more protrusions in the bottom surface of the protrusion and depression portions of the patterned metal sheet.

Thus, adhesion between the overcoat and the patterned metal sheet can be improved by increasing the area where the patterned metal sheet contacts the adhesive layer of the overcoat so that the life-span of the organic light emitting diode can be improved by completely blocking the permeation of external moisture.

Further, the protrusions and the oxide silicon particles are formed in the bottom surface of the patterned metal sheet and have a regular shape so that the entire surface of the thin film encapsulation layer can be uniformly reformed, thereby equalizing the life-span of the respective organic light emitting diodes.

In addition, the moisture permeation path is increased by using the patterned metal sheet having the protrusion and depression portions so that the moisture absorption time can be extended, thereby improving the life-span of the organic light emitting diode.

In addition, chemical treatment of a silane coupling agent for improving adhesion between the overcoat formed of the organic layer and the metal sheet is not required, and accordingly additional contamination due to outgas can be prevented.

Further, surface uniformity can be improved by forming the patterned metal sheet having the regular-shaped protrusion and depression portions in the thin film encapsulation layer. Accordingly, when the filling material is filled, the filing material applies uniform pressure to the entire surface, thereby preventing damage to the organic light emitting diode due to pressure.

DETAILED DESCRIPTION OF THE EMBODIMENTS

Figure 1:
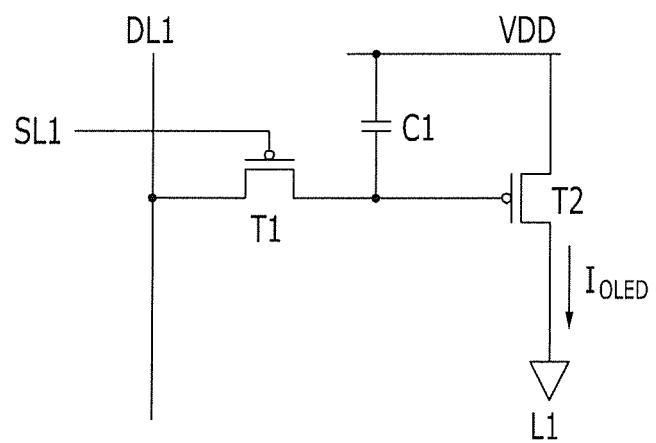
FIG. 1 is an equivalent circuit diagram of an organic light emitting diode (OLED) display according to an exemplary embodiment.

The present invention will be described hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, the size and thickness of each component shown in the drawings are arbitrary, and are used to enhance understanding and for ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
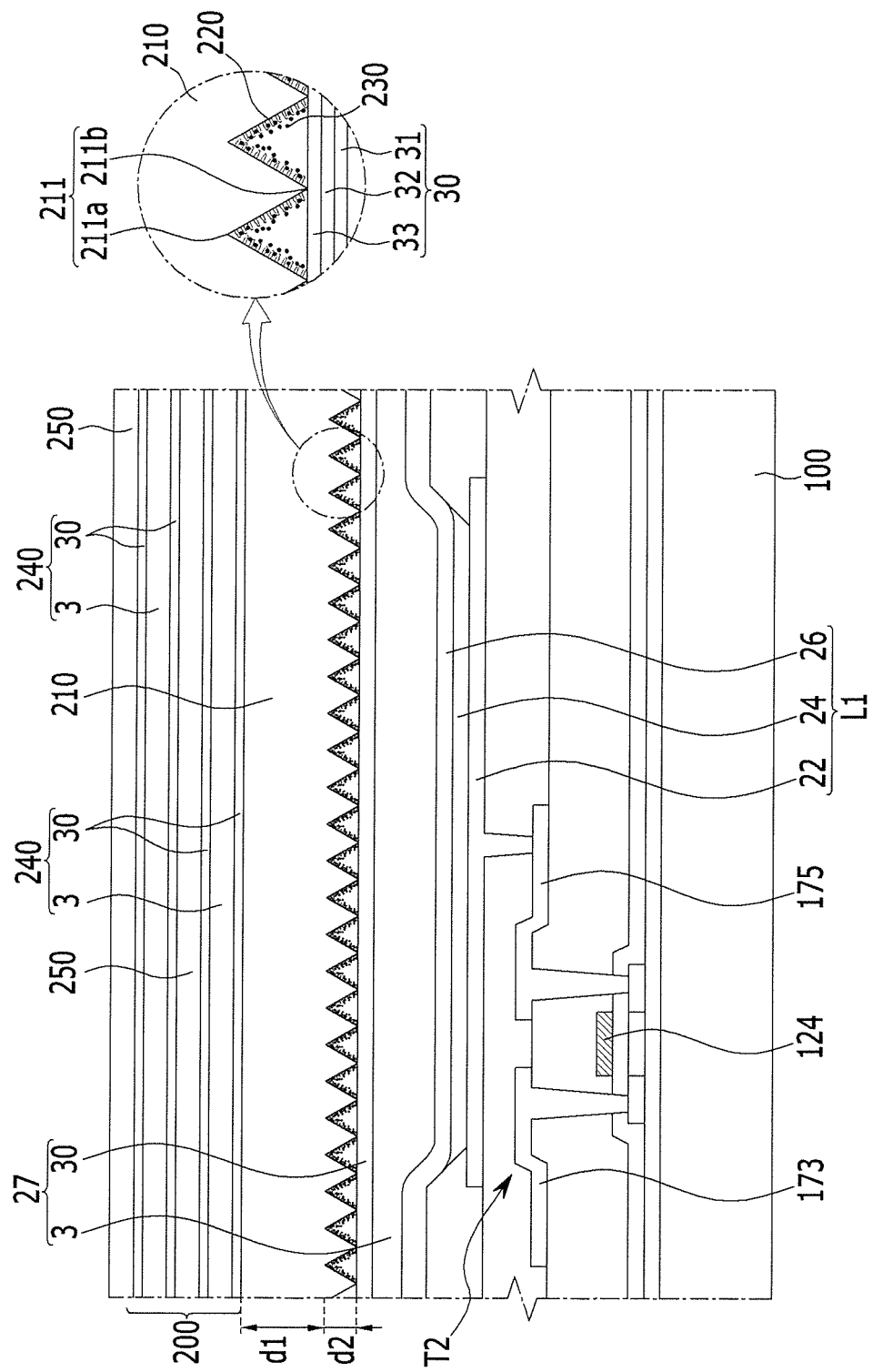
FIG. 2 is a cross-sectional view of an OLED display according to an exemplary embodiment.

FIG. 1 is an equivalent circuit diagram of an organic light emitting diode (OLED) display according to an exemplary embodiment, and FIG. 2 is a cross-sectional view of the OLED display according to the exemplary embodiment.

As shown in FIG. 1 and FIG. 2, each pixel of the OLED display is formed of an organic light emitting diode L1 and a driving circuit. The organic light emitting diode L1 includes a pixel electrode (i.e., a hole injection electrode) 22, an organic emission layer 24, and a common electrode (i.e., an electron injection electrode) 26.

The organic emission layer 24 may further include an emission layer (not shown) where light is substantially emitted, and organic layers (not shown) for efficient transmission of carriers of holes or electrons to an emission layer. The organic layers may include a hole injection layer (HIL) and a hole transport layer (HTL) disposed between the pixel electrode 22 and the emission layer, and a hole injection layer (HIL) and a hole transport layer (HTL) disposed between the common electrode 26 and the emission layer.

The driving circuit includes at least two thin film transistors T1 and T2 and at least one storage capacitor C1. The thin film transistor basically includes a switching transistor T1 and a driving transistor T2.

The switching transistor T1 is connected to a scan line SL1 and a data line DL1, and transmits a data voltage input to the data line DL1 according to a switching voltage input from the scan line SL1 to the driving transistor T2. The storage capacitor C1 is connected to the switching transistor T1 and a power source line VDD, and stores a voltage corresponding to the voltage difference between the voltage transmitted from the switching transistor T1 and the voltage supplied to the power source line VDD.

The driving transistor T2 is connected to the power source line VDD and the storage capacitor C1 to supply an output current $I_{OLED}$ that is proportional to a square of the difference between the voltage stored in the storage capacitor C1 and a threshold voltage to the organic light emitting diode L1, and the organic light emitting diode L1 emits light by the output current $I_{OLED}$. The driving transistor T2 includes a gate electrode 124, a source electrode 173, and a drain electrode 175, and the pixel electrode 22 may be connected to the drain electrode 175 of the driving transistor T2. The structure of the pixel is not limited to the above-stated structure, and it may be variously modified.

As shown in FIG. 2, an overcoat 27 is formed on the common electrode 26 (formed on the substrate 100) to protect the common electrode 26 by covering the same.

The overcoat 27 includes an organic layer 3 and an adhesive layer 30 formed on the organic layer 3. The adhesive layer 30 is formed by sequentially layering a first filling adhesive layer 31, a moisture-absorbing adhesive layer 32, and a second filling adhesive layer 33. The first filling adhesive layer 31 and the second filling adhesive layer 33 include filling materials, and the moisture-absorbing adhesive layer 32 includes a moisture absorbing material.

A thin film encapsulation layer 200 is formed on the overcoat 27. The thin film encapsulation layer 200 is formed on the plurality of organic light emitting diodes L1 and the driving circuit to seal the organic light emitting diodes L1 and the driving circuit from the external environment for protection.

The thin film encapsulation layer 200 includes a patterned metal sheet 210 attached on the overcoat 27 and having protrusion and depression portions 211 on its surface, an organic sheet 240 attached on an upper surface of the protrusion and depression portions 211 of the patterned metal sheet 210, and a flat metal sheet 250 attached on an upper surface of the organic sheet 240.

The protrusion and depression portions 211 of the patterned metal sheet 210 have alternating convex portions 211a and recess portions 211b, and may be formed in the shape of a regular tetrahedral pyramid. A height d2 of each convex portion 211a of the protrusion and depression portions 211 may be 10% to 100% of the thickness d1 of the patterned metal sheet 210.

When the height d2 of the convex portions 211a of the protrusion and depression portions 211 is smaller than 10% of the thickness d1 of the patterned metal sheet 210, the contact area of the patterned metal sheet 210 and the overcoat 27 cannot be increased so that adhesion therebetween cannot be improved. When the height d2 of the convex portions 211a of the protrusion and depression portions 211 is larger than 100% of the thickness 1l of the patterned metal sheet 210, flexibility is decreased, thereby forming a crack.

When the thickness of the metal sheet is 10 μm and the height of the convex portions 211a of the metal sheet is 10 μm, 1000 protrusion and depression portions 211 may be formed in every 1 cm$^2$.

A plurality of protrusions 220 are formed in the bottom surface of the patterned metal sheet 210, and the protrusion and depression portions 211 of the patterned metal sheet 210 face the overcoat 27 at the bottom surface. The plurality of protrusions 220 may be dendrites formed by physical and chemical coupling to the patterned metal sheet 210 through a surface treatment process (e.g., electroplating) performed on the patterned metal sheet 210.

The patterned metal sheet 210 and the protrusions 220 may be formed of the same materials, and the materials may include copper (Cu), aluminum (Al), Steel Use Stainless (SUS), and the like.

The diameter of each protrusion 220 may be about 1 to about 5 μm. When the diameter of the protrusion 220 is smaller than about 1 μm, adhesion between the patterned metal sheet 210 and the overcoat 27 is deteriorated, and when the diameter of the protrusion 220 is larger than about 5 μm, flexibility is decreased, thereby causing a crack.

Surface roughness of the protrusion and depression portions 211 where the plurality of protrusions 220 are formed may be calculated by measuring the surface roughness of the protrusion and depression portions 211 using a 10 point average (Rz) calculation method. The protrusion and depression portions 211 of the patterned metal sheet 210 of the OLED display according to an exemplary embodiment may have a surface roughness (Rz) of about 1 to about 5 μm. When the surface roughness of the protrusion and depression portions 211 is smaller than about 1 μm, the adhesion between the patterned metal sheet 210 and the overcoat 27 is deteriorated, and when the surface roughness of the protrusion and depression portions 211 is larger than about 5 μm, the flexibility is decreased, thereby causing a crack.

Silicon oxide particles ($SiO_2$) 230 may be attached to the protrusions 220 of the protrusion and depression portions 211. The silicon oxide particles 230 are physically attached to the protrusion and depression portions 211 to enhance hydrogen bonding forces between the protrusion and depression portions 211 and the adhesive layer, and to ease external stress.

A ratio of the silicon oxide particles 230 with respect to the protrusions 220 may be about 1 wt % to about 20 wt %. When the ratio of the oxide silicon particles 230 with respect to the protrusions 220 is less than about 1 wt %, the adhesion cannot be improved due to the silicon oxide particles 230, and when the ratio is greater than about 20 wt %, the contact area of the adhesive layer 20 of the overcoat 27 is decreased so that the adhesion may be decreased.

The organic sheet 240 and the flat metal sheet 250 are alternately layered one by one, and FIG. 2 illustrates that two organic sheets 240 and two flat metal sheets 250 are alternately layered.

The organic sheet 240 includes an organic layer 3 and adhesive layers 30 formed above and below the organic layer 3. The adhesive layer 30 is formed by sequentially layering the first filling adhesive layer 31, the moisture-absorbing adhesive layer 32, and the second filling adhesive layer 33. The first filling adhesive layer 31 and the second filling adhesive layer 33 include filling materials, and the moisture-absorbing adhesive layer 32 includes a moisture-absorbing material.

The adhesive layer 30 adheres the overcoat 27 and the patterned metal sheet 210 in the thin film encapsulation layer 200, and adheres the organic sheet 240 in the thin film encapsulation layer 20 and the flat metal sheet 250. The adhesive layer 30 includes a moisture-absorbing material simultaneously having moisture-absorbing/moisture-adsorbing characteristics, and a filling material that can block external moisture by providing a barrier to the permeation of external moisture. Accordingly, the adhesive layer 30 can improve the life-span of the organic light emitting diode L1 by protecting the same from moisture.

The first filling adhesive layer 31, the moisture-absorbing adhesive layer 32, or the second filling adhesive layer 33 may be manufactured from a composition formed by mixing the filling material or the moisture-absorbing material with a thermosetting resin or a photo-curable resin. The composition will be described later.

When the first filling adhesive layer 31, the moisture-absorbing adhesive layer 32, and the second filling adhesive layer 33 are manufactured from a composition including homogeneous thermosetting resins or photo-curable resins, interlayer boundaries between the first filling adhesive layer 31, the moisture-absorbing adhesive layer 32, and the second filling adhesive layer 33 are not formed therebetween such that they may be formed as one sheet.

The moisture-absorbing material included in the moisture-absorbing adhesive layer 32 may be a getter material that can be easily reacted with moisture and an activated gas such as oxygen to prevent the activated gas from damaging the organic light emitting diode L1. For example, a dry material that is a getter material capable of eliminating moisture may be used. Such a moisture-absorbing material may be a particle or a medium having moisture and oxygen absorbing/adsorbing characteristics, and any material capable of absorbing and adsorbing moisture and oxygen may be used, and the type of the material is not restrictive.

The moisture-absorbing material may be, for example, silica gel ($SiO_2 \circ H_2O$), alumino-silicate beads, clay such as montmorillonite, zeolite ($Na_{12}AlO_3SiO_2 \circ 12H_2O$) as a molecular sieve, activated carbon, alkali metal oxide, alkaline earth metal oxide, metal sulfate, metal halide, and metal per chlorate, or a combination thereof.

In further detail, the alkaline metal oxide may be lithium oxide ($Li_2O$), sodium oxide ($Na_2O$), or potassium oxide ($K_2O$); the alkaline earth metal oxide may be barium oxide (BaO), calcium oxide (CaO), or magnesium oxide (MgO); the metal sulfate may be lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2SO_{43}$), titanium sulfate ($TiSO_{42}$), or nickel sulfate ($NiSO_4$); the metal halide may be calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cerium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); and the metal per chlorate may be barium per chlorate ($BaClO_{42}$) or magnesium per chlorate ($MgClO_{42}$), but these materials are not limited to these compounds.

The silica gel is amorphous silica made from sodium silicate and sulfuric acid and has an excellent adsorption amount of about 40 wt % with respect to a weight of water. When the adsorption capacity is increased at a temperature below 25° C. and the temperature is increased, the adsorption capacity is decreased to be similar to that of clay. The silica gel has the advantage of being non-toxic, non-corrosive, and non-aqueous. In addition, the silica gel is low in cost and can be easily handled, and does not cause contamination-related problems. Accordingly, the silica gel is most widely used.

Montmorillonite or alumino-silicate beads are adsorbents formed in the shape of beads by performing a drying process on magnesium aluminum silicate in the form of natural subbentonite, and is advantageously low in cost. However, there is a risk of being contaminated because the absorbent is easily powdered, and moisture adsorption of the adsorbent is inferior to the silica gel.

Zeolite has a crystal network micro-sphere structure and has a relatively large specific surface area of about 700 $m^2$ to 800 $m^2$ per gram, and, unlike silica gel or clay, zeolite does not discharge moisture to the product in a package as temperature increases, but it has the drawback of being high in cost.

Activated carbon has excellent adsorption characteristics since it has a relatively large specific surface area of about 200 $m^2$ to 1200 $m^2$ per gram, but it is not commonly used as a desiccant because, it may contaminate the product.

Among the alkaline earth metal oxides, calcium oxide is calcinated or recalcinated lime having moisture adsorption of lower than about 28.5 wt % and is usually used for dehumidified packaging of cold food or frozen food because it has moisture adsorption characteristics in low relative humidity.

Among the metal sulfates, calcium sulfate, commercially known as Drierite, is manufactured by dehydrating gypsum and chemically stabilizing it so that it is non-disintegrating, non-toxic, and non-corrosive, and does not discharge adsorbed moisture even though temperature is increased. However, calcium sulfate is used only within a limited range because the moisture adsorption of calcium sulfate is as low as about 10 wt %.

The filling material that can be used in the first filling adhesive layer 31 and the second filling adhesive layer 33 have moisture barrier characteristics. Any filler having the barrier characteristic can be used in the adhesive layer 30 as the filling material. In further detail, talc, silica, magnesium oxide, mica, montmorillonite, alumina, graphite, beryllium oxide, aluminum nitride, silicon carbide, mullite, silicon, or combination thereof may be used. Such a filling material may be a particle manufactured by composition or a particle processed from rough.

Filling materials included in the resin compositions for the first filling adhesive layer 31 and the second filling adhesive layer 33 are uniformly distributed into the composition after being cured, and thus stress applied to the compositions is dispersed so that the adhesive force can be reinforced and moisture permeation into the composition can be effectively suppressed, thereby preventing the spread of moisture toward the organic light emitting diode L1 through the first filling adhesive layer 31 or the second filling adhesive layer 33.

A particle diameter of the moisture-absorbing material may be about 10 nm to about 20 um. For example, an average particle diameter of the moisture-absorbing material may be about 10 nm to about 100 nm.

A particle diameter of the filling material may be about 10 nm to about 20 um. For example, an average particle diameter of the filling material may be about 10 nm to about 100 nm. Alternatively, an average particle diameter of the filling material may be about 2 um to about 5 um according to another example.

The moisture-absorbing material or the filling material may be a mesoporous type, a plate type, a sphere type, a rod type, a fiber type, or a core-shell type, and the shape is not restrictive.

The first filling adhesive layer 31 or the second filling adhesive layer 33 may include about 5 to about 50 parts by weight of filling material with respect to 100 parts by weight of thermosetting resin or photo-curable resin. In some embodiments, the content of the filling material is included in a range of about 5 to about 50 parts by weight with respect to 100 parts by weight of thermosetting resin or photo-curable resin for improvement of the barrier characteristic with respect to moisture permeation.

The moisture-absorbing adhesive layer 32 may include about 5 to about 50 parts by weight of moisture-absorbing material with respect to 100 parts by weight of thermosetting resin or photo-curable resin.

The thickness of the adhesive layer 30 may be about 5 um to about 50 um. For example, the thickness of the adhesive layer 30 may be about 10 um, about 20 um, or about 30 um. When the thickness of the adhesive layer 30 is within the above-stated range, the adhesive layer 30 can readily acquire adhesive characteristics without the influence of a surface step.

The first filling adhesive layer 31, the moisture-absorbing adhesive layer 32, and the second filling adhesive layer 33 may have a thickness ratio of about 0.1:1.2:0.1 to about 1.2:0.1:1.2. For example, each layer may be manufactured with a ratio of 1:1:1. When the thickness ratio is within the above-stated range, the adhesive characteristics can be readily acquired without the influence of a surface step.

The OLED display 100 includes the adhesive layer 30 so that reliability of the organic light emitting diode 20 can be improved. When the encapsulation substrate is not made of glass, moisture may be introduced through a pin-hole or a defect portion or through pores formed by particles, and the absorbing-adhesive layer in the adhesive layer 30 absorbs or adsorbs the moisture, or the filling adhesive layer blocks the permeation of moisture to thereby protect the organic light emitting diode 20.

In general, a getter may be coated on an outer edge portion of the organic light emitting diode L1 to protect the organic light emitting diode L1 from external moisture, and a process for forming the getter can be omitted in the OLED display 100 so that the manufacturing process can be shortened. Further, when the getter forming process is omitted, a getter line is not needed in the outer edge portion so that a bezel can be minimized.

When the adhesive layer 30 is formed with a sandwich structure of the first filling adhesive layer 31, the moisture-absorbing adhesive layer 32, and the second filling adhesive layer 33, the moisture-absorbing adhesive layer 32 effectively blocks moisture introduced into the organic light emitting diode L1, and the filling adhesive layers 31 and 33 can be adhered to the substrate 10, the organic light emitting diode L1, and the thin film encapsulation layer 200 while maintaining adhesion strength. That is, the adhesive layer 30 effectively blocks moisture from the organic light emitting diode 20 while maintaining its adhesive characteristic to thereby improve the life-span of the organic light emitting diode L1 by increasing reliability.

As described above, the first filling adhesive layer 31, the moisture-absorbing adhesive layer 32, and the second filling adhesive layer 33 may be manufactured from a composition including a filling material or a composition including a moisture-absorbing material. Such a composition for the first filling adhesive layer 31, the moisture-absorbing adhesive layer 32, and the second filling adhesive layer 33 may include a thermosetting resin or a photo-curable resin, as described above. Alternatively, the composition may include a thermosetting agent, a curing accelerator, a coupling agent, a spacer, a photoacid generator, and a radical initiator or an additive, or a combination of these, and further includes a solvent.

When the first filling adhesive layer 31, the moisture-absorbing adhesive layer 32, and the second filling adhesive layer 33 are manufactured using a thermosetting resin composition, the composition may include a thermosetting resin, a thermosetting agent, a curing accelerator, a coupling agent, an antioxidant, and a solvent, and further includes a moisture-absorbing material or a filling material.

The thermosetting resin, for example, includes an epoxy resin. Nonlimiting examples of the epoxy resin include a bisphenol-based epoxy resin, an ortho-Cresol novolac-based epoxy resin, a microfunctional epoxy, an amine-based epoxy, a heterocyclic-containing epoxy, a substituted-type epoxy, and a naphthol-based epoxy. In further detail, the epoxy resin may include a bisphenol-A type epoxy resin, a bisphenol-F type epoxy resin, a hydrogenated bisphenol-A type epoxy resin, an alicyclic epoxy resin, a directional epoxy resin, a novolac-type epoxy resin, and a dicyclopentadiene epoxy resin. A single compound including the epoxy group may be used or a mixture may be used. As epoxy resins available in the market, the bisphenol-based epoxy resins include Epiclon 830-S, Epiclon EXA-830CRP, Epiclon EXA 850-S, Epiclon EXA-850CRP, and Epiclon EXA-835LV manufactured by Dianippon Ink and Chemicals (DIC), Epikote 807, Epikote 815, Epikote 825, Epikote 827, Epikote 834, Epikote 1001, Epikote 1004, Epikote 1007, and Epikote 1009 manufactured by Yuka-Shell Epoxy, DER-330, DER-301, and DER-361 manufactured by Dow chemical, YD-128 and YDF-170 manufactured by Kukdo Chemical. Some commercially available ortho-Cresol novolac-based epoxy resins include YDCN-500-1P, YDCN-500-4P, YDCN-500-5P, YDCN-500-7P, YDCN-500-80P, and YDCN-500-90P manufactured by Kukdo Chemical and EOCN-1025, EOCN-1035, EOCN-1045, EOCN-1012, EOCN-1025, and EOCN-1027 manufactured by DIC. Some commercially available microfunctional epoxy resins include Epon 1031S manufactured by Yuka-Shell Epoxy and Araldite 0163 manufactured by Ciba Speciality Chemicals, Denacol EX-611, Denacol EX-614, Denacol EX-614B, Denacol EX-622, Denacol EX-512, Denacol EX-521, Denacol EX-421, Denacol EX-411, and Denacol EX-321 manufactured by Nagase ChemteX Corporation. Some commercially available amine-based epoxy resins include Epikote 604 manufactured by Yuka-Shell Epoxy YH-434 manufactured by Toto Chemical, TETRAD-X and TETRAD-C manufactured by Mitsubishi Gas Chemical, and ELM-120 manufactured by Sumitomo Chemical. A commercially available heterocyclic-containing epoxy resin is PT-810 manufactured by Ciba Speciality Chemicals. Some commercially available substituted-type epoxy resins include ERL-4234, ERL-4299, ERL-4221, and ERL-4206 manufactured by UCC. Some commercially available naphthol-based epoxy resins include Epiclon HP-4032, Epiclon HP-4032D, Epiclon HP-4700, and Epiclon 4701 manufactured by DIC. These products may be used alone or two or more types of the products may be mixed. For good film coating characteristics, a phenoxy resin and a polymer resin (such as Epikoto 1256 manufactured by JER, PKHH manufactured by InChem, and YP-70 manufactured by Tohto Kasei) may be used.

As the thermosetting agent, any thermosetting agent that can be used to thermoset an epoxy resin may be used. In detail, a polyamine-based curing agent including diethylenetriamine, triethylenetetramine, N-Aminoethylpiperazine, diaminodiphenylmethane, adipic acid hydrazide, an acid anhydride curing agent including phthalic anhydride, tetrahydrophthalic anhydride, hexahydrophthalic anhydride, methyltetrahydrophthalic anhydride, methylhexahydrophthalic anhydride, and methyl nadic acid anhydride, a phenol novolac curing agent, a polymercaptan curing agent including a trioxantrithylene mercaptan, a tertiary amine compound including benzyldimethylamine and 2,4,6-tris(dimethylaminomethyl)phenol, and an imidazole compound including 2-methylimidazole, 2-ethyl-4-methylimidazole, 1-benzyl-2-methylimidazole. Alternatively, a solid dispersion latent curing agent or a latent curing agent encapsulated in a micro capsule may also be used.

When an amine-based curing agent is used, an aliphatic amine, aromatic amine, modified aliphatic amine, secondary amine, or tertiary amine may be used. For example, some exemplary amine-based curing agents include benzyldimethylamine, triethanolamine, triethylenetetramine, diethylenetriamine, triethyleneamine, dimethylaminoethanol, tri (dimethylaminomethyl) phenol. Alternatively, the curing agent may have —OH, —COOH, —SO$_3$H, —CONH$_2$, —CONHR (R denotes an alkyl group), —CN(CN)NH$_2$, —SO$_3$NH$_2$, —SO$_3$NHR (R denotes an alkyl group), or —SH at one end group. The R is a C1 to C10 alkyl group, which includes linear- or branched-chain saturated hydrocarbon groups of carbon numbers 1 to 10, and in some embodiments, includes linear- or branched-chain alkyl groups of C1 to C4. In further detail, R may methyl, ethyl, n-propyl, isopropyl, isobutyl, n-butyl, t-butyl, or the like.

Nonlimiting examples of imidazole-based curing agents include imidazole, isoimidazole, 2-methylimidazole, 2-ethyl-4-methylimidazole, 2,4-dimethylimidazole, butylimidazole, 2-heptadecenyl-4-methylimidazole, 2-methylimidazole, 2-undecenal imidazole, 1-vinyl-2-methylimidazole, 2-n-heptadecenylimidazole, 2-undecylimidazole, 2-heptadecenylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, an adduct of imidazole and methylimidazole, an adduct of imidazole and trimellitic acid, 2-n-heptadecyl-4-methylimidazole, phenylimidazole, benzylimidazole, 2-methyl-4,5-diphenylimidazole, 2,3,5-triphenylimidazole, 2-silylimidazole, 1-(dodecyl benzyl)-2-methylimidazole, 2-(2-hydroxy-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzen-1,4,2-naphthyl-4,5-diphenylimidazole, 1-benzyl-2-methylimidazole, 2-p-methoxysilylimidazole, and the like may be used.

The acid anhydride curing agent is appropriate when a hybrid epoxy resin including siloxane is used as the epoxy resin.

In some embodiments, as the curing agent, the acid anhydride is phthalic anhydride, maleic anhydride, trimelltic anhydride, pyromellitic anhydride, hexahydrophthalic anhydride, tetrahydrophthalic anhydride, methyl nadic anhydride, nadic anhydride, glutaric anhydride, methylhexahydrophthalic anhydride, methyltetrahydrophthalic anhydride, or 5-(2,5-dioxotetrahydro)-3-methyl-3-cyclohexen-1,2-dicarboxylic anhydride.

As the curing accelerator, quaternary ammonium salts, quaternary sulfonium salts, various metal salts, imidazoles, tertirary amines, and the like may be used. In further detail, tetra methyl ammonium bromide or tetrabutylammonium bromide, for example, may be used as the quaternary ammonium salt; tetraphenyl phosphonium bromide, for example, may be used as the quaternary sulfonium salt; octyl acid zinc or octyl acid tin, for example, may be used as the metal salt; 1-benzyl-2-methyl imidazole, 1-benzyl-2-phenyl imidazole, or 2-ethyl-4-methyl imidazole, for example, may be used as the imidazole; and benzyl dimethyl amine, for example, may be used as the tertiary amine.

Nonlimiting examples of boron-based curing accelerators include phenyl boronic acid, 4-methylphenylboronic acid, 4-methoxyphenyl boronic acid, 4-trifluoromethoxyphenyl boronic acid, 4-tert-butoxyphenyl boronic acid, 3-fluoro-4-methoxyphenyl boronic acid, pyridinetriphenylborane, 2-ethyl-4-methyl imidazoliumtetraphenylborate, 1,8-diazabicyclo[5.4.0]undecene-7-tetraphenylborate, 1,5-diazabicyclo[4.3.0]nonene-5-tetraphenylborate, lithium triphenyl (n-butyl)borate, and the like. Nonlimiting examples of imidazole curing accelerators include 2-methylimidazole, 2-undecylimidazole, 2-heptadecylimidazole, 2-ethyl-4-methylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium-trimellitate, 1-cyanoethyl-2-phenylimidazolium-trimellitate, 2,4-diamino-6-[2'-methylimidazolyl-1']-ethyl-s-triazine, 2,4-diamino-6-[2'-undecylimidazolyl-1']-ethyl-s-triazine, 2,4-diamino-6-[2'-ethyl-4'-methylimidazolyl-1']-ethyl-striazine, 2,4-diamino-6-[2'-methylimidazolyl-1']-ethyl-s-triazine isocyanuric acid adduct dihydrate, 2-phenylimidazole isocyanuric acid adduct, 2-methylimidazole isocyanuric acid adduct dihydrate, 2-phenyl-4,5-dihydroxymethylimidazole, 2-phenyl-4-methyl-5-hydroxymethylimidazole, 2,3-dihydro-1H-pyrrolo[1,2-a]benzimidazole, 4,4'-methylene bis(2-ethyl-5-methylimidazole), 2-methylimidazoline, 2-phenylimidazoline, 2,4-diamino-6-vinyl-1,3,5-triazine, 2,4-diamino-6-vinyl-1,3,5-triazine isocyanuric acid adduct, 2,4-diamino-6-methacryloyloxyethyl-1,3,5-triazineisocyanuric acid adduct, 1-(2-cyanoethyl)-2-ethyl-4-methylimidazole, 1-cyanoethyl-2-methylimidazole, 1-(2-cyanoethyl)-2-phenyl-4,5-di-(cyanoethoxymethyl) imidazole, 1-acetyl-2-phenylhydrazine, 2-ethyl-4-methyl imidazoline, 2-benzyl-4-methyl dimidazoline, 2-ethyl imidazoline, 2-phenyl imidazole, 2-phenyl-4,5-dihydroxymethylimidazole, melamine, dicyanodiamide, and the like. A single one or a mixture of two or more of the above may be used.

As the coupling agent, a silane coupling agent, a titanate-based coupling agent, an aluminate-based coupling agent, a silicon compound, and the like may be used, and a single one or a mixture may be used. When the coupling agent is included, adhesion of the resin composition can be improved and viscosity can be decreased. In some embodiments, the coupling agent is included in an amount of about 0.001 to about 5 parts by weight, for example, about 0.01 to about 3 parts by weight based on 100 parts by weight of the thermosetting resin in the thermosetting resin composition.

The silane coupling agent functions as an adhesion promoter for promoting the adhesive force between the surface of the inorganic material such as silica in the composition) and the resins. As the silane coupling agent, a silane containing epoxy, a silane containing amine, a silane containing mercapto, or a silane containing isocyanate may be used. Nonlimiting examples of the silane containing epoxy include 2-(3,4epoxy cyclo hexyl)-ethyltrimethoxysilane, 3-glycidoxytrimethoxysilane, 3-glycidoxypropyltriethoxysilane. Nonlimiting examples of the silane containing an amine group include N-2(aminoethyl)-3-aminopropylmethyldimethoxysilane, N-2(aminoethyl)-3-aminopropyltrimethoxysilane, N-2(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine, and N-phenyl-3-aminopropyltrimethoxysilane. Nonlimiting examples of the silane containing mercapto include 3-mercaptopropylmethyldimethoxysilane and 3-mercaptopropyltriethoxysilane. Nonlimiting examples of the silane containing isocyanate include 3-isocynateprophytriethoxysilane. One of the above may be used or a combination of two or more of the above may be used.

The antioxidant prevents oxidation deterioration upon thermosetting the thermosetting resin composition to further improve stability of the curing material. As the antioxidant, a phenol-based antioxidant, a sulfur-based antioxidant, or a phosphorus-based antioxidant may be used. Nonlimiting examples of the phenol-based antioxidant include dibutyl hydroxy toluene and 2,6-ditetra-butyl-p-cresol (hereinafter, referred to as BHT). Nonlimiting examples of the sulfur-based antioxidant include mercaptopropionic acid derivatives. Nonlimiting examples of the phosphorus-based antioxidant include triphenylphosphite and 9,10-dihydro-9-oxa-10-phosphaphenanthrene-10-oxide (hereinafter referred to as HCA). A single antioxidant may be used or a mixture of two or more may be used. In some embodiments, the antioxidant is included in an amount of about 0.001 to about 5 parts by weight, for example, about 0.01 to about 0.5 parts by weight based on 100 parts by weight of the thermosetting resin in the thermosetting resin composition.

The composition for the first filling adhesive layer 31, the moisture-absorbing adhesive layer 32, and the second filling adhesive layer 33 is manufactured from a photo-curable resin composition, a photo-curable epoxy resin, a photoinitiator, a coupling agent, a spacer, a photoacid generator, and a radical generator. A solvent may be included. A filling material or a moisture-absorbing material is further included.

As a photocurable epoxy resin that is applicable to the photocurable resin composition, a commonly used aromatic epoxy resin, an alicyclic epoxy resin, or a mixture thereof may be used. Nonlimiting examples of the aromatic epoxy resin include a biphenyl type epoxy resin, a bisphenol A type epoxy resin, a bisphenol F type epoxy resin, a phenol novolac type epoxy resin, and a dicyclopentadiene type epoxy resin. A single resin may be used or a mixture can be used.

Any photoinitiator that can cure the epoxy resin by light is used. Nonlimiting examples of the photoinitiator include aromatic diazonium salts, aromatic sulfonium salts, aromatic iodide aluminum salts, aromatic sulfonium aluminum salts, metallocene compounds, and iron-rarin compounds. In some embodiments, the aromatic sulfonium salt may be used. For example, the aromatic sulfonium salt may include an aromatic sulfonium hexafluoro phosphate compound or an aromatic sulfonium hexafluoro antimonite compound.

As the coupling agent, a silane-based or titanium-based coupling agent, or a silicon compound may be used, and a single compound can be used or a combination can be used. In some embodiments, a silane coupling agent containing alkoxysilane and diglycidyl ether in one molecule is used as the coupling agent.

As the spacer, any spacer that can maintain a constant thickness for the panel after being cured, and a spacer that can maintain the thickness of the panel to be about 5 to about 50 um, for example, about 5 to about 25 um may be used as the spacer. The shape of the spacer may be a sphere shape or a log shape, and the shape of the spacer is not restrictive as long as it can maintain a constant thickness of the panel.

As the photoacid generator, any photoacid generator that can generate a Lewis acid or a Bronsted acid through light exposure can be used, and a sulfate-based compound such as an organic sulfonic acid or an onium-based compound such as onium salt may be used. Nonlimiting examples of the photoacid generator include phthalimido trifluoromethanesulfonate, dinitrobenzyl tosylate, n-decyldisulfonate, naphthylimido trifluoromethanesulfonate, diphenyliodonium, hexafluorophosphate, hexafluoroarsenate, hexafluoroantimonate, diphenylparamethoxyphenylsulfonium triflate, diphenylparatoluenylsulfonium triflate, diphenylparaisobutylphenylsulfonium triflate, triphenylsulfonium hexafluoroarsenate, triphenylsulfonium hexafluoro antimonate, triphenylsulfonium triflate, dibutylnaphthylsulfonium triflate, and mixtures thereof.

The radical generator may be used together with the photoacid generator. The radical polymerization initiator in the curable resin composition may be a radical polymerization initiator generating radicals by being decomposed by an electromagnetic energy ray such as a UV ray, or a heat deposition radical polymerization initiator generating radicals by being decomposed by heat. As the radical polymerization initiator, an alpha cleavage (type I) initiator such as an acetophenone derivative including 2-hydroxy-2-methylpropiophenone and 1-hydroxycyclohexyl phenyl ketone, an acyl phosphine oxide derivative including (2,4,6-trimethylbenzoyl)phenylphospine oxide, and a benzoin ether derivative may be used. Some commercially available radical polymerization initiators include IRGACURE 651, IRGACURE 184, IRGACURE 907, DAROCUR 1173, and IRGACURE 819 manufactured by Ciba Speciality Chemical. A type II photo initiator may be used, and nonlimiting examples of the type II photo initiator include compounds such as benzophenone, isopropyl thioxantone, and anthraquinone. Various substituted derivatives of such basic compounds may be used. Nonlimiting examples of a thermally decomposable radical polymerization initiator include peroxides such as 1,1,3,3-tetramethylbutylperoxy-2-ethyl-hexanoate, 1,1-bis(t-butylperoxy)cyclohexane, 1,1-bis(t-butylperoxy)cyclo-dodecane, di-t-butylperoxyisophthalate, t-butylperoxybenzoate, dicumylperoxide, t-butylcumylperoxide, 2,5-dimethyl-2,5-di(t-butylperoxy)-3-hexyne, and cumane hydroperoxide. The amount of the radical polymerization initiator is about 0.01 to about 5 parts by weight based on 100 parts by weight of the photo-curable resin in the photo-curable resin composition.

Nonlimiting examples for the solvent that can be used in the composition for the first filling adhesive layer 31, the moisture-absorbing adhesive layer 32, and the second filling adhesive layer 33 include methylethylketone (MEK), tetrahydrofuran (THF), and toluene. Any solvent that can produce a liquid for forming a film can be used. A single solvent may be used or a mixture of solvents may be used in order to acquire good coating characteristics.

Each composition of the first filling-adhesive layer 31, the moisture-absorbing adhesive layer 32, and the second filling-adhesive layer 33 is coated on the film and then dried to form a sheet such that the adhesive layer 30 may be formed by layering the sheets, and the method for manufacturing the adhesive layer 30 is not restrictive. Any method known to a person in the art may be used. When the desired characteristic can be realized by forming the sheet, the sheet may be formed as a non-cured gel or a solid phase, or may be manufactured as a liquid phase and then post-processed.

Table 1 (below) shows the results of an adhesion strength test and a life-span test for the OLED display manufactured according to first through fifth exemplary embodiments, and a comparative example of an OLED display manufactured according to the prior art.

In exemplary embodiment 1, a protrusion 220 having a diameter of 0.5 µm is formed in a flat metal sheet 250. In exemplary embodiment 2, a protrusion 220 having a diameter of 0.5 µm and silicon oxide particles 230 are formed in a flat metal sheet 250. In exemplary embodiment 3, the height of a convex portion 221a of a patterned metal sheet 230 having protrusion and depression portions 211 is 5 µm. In exemplary embodiment 4, a protrusion 220 having a diameter of 0.5 µm is formed in a patterned metal sheet 210 and has a convex portion 211a with a height of 5 µm. In exemplary embodiment 5, a protrusion 220 has a diameter of 0.5 µm and silicon oxide particles 230 are formed in a patterned metal sheet 210 in which a convex portion 211a has a height of 5 µm. In a comparative example, a protrusion 220 and the protrusion and depression portions 211 are not formed in a flat metal sheet 250.

The adhesion strength was measured by measuring the strength needed to detach the overcoat 27 and the metal sheet of the OLED displays manufactured according to the exemplary embodiments 1 to 5 and the comparative example using UTM (model-5900 manufactured by Instron).

For the life-span test, the OLED displays manufactured according to the exemplary embodiments 1 to 5 and the comparative example were put into a chamber (manufactured by TH-TG_JEIO TECH) with 85% RH (relative humidity) at 85° C. and the light emission unit was observed with respect to time, thereby measuring the time it took to generate a dark spot.

TABLE 1

| | Comparative Example | exemplary embodiment 1 | exemplary embodiment 2 | exemplary embodiment 3 | exemplary embodiment 4 | exemplary embodiment 5 |
|---|---|---|---|---|---|---|
| adhesion strength (N/m) | 118 | 267 | 372 | 506 | 1082 | 1342 |
| Dark spot generation time (time) | 365 | 520 | 698 | 635 | 1680 | 2351 |

As shown in Table 1, the adhesion strength was improved and the life-span was increased in the exemplary embodiments 1 to 5 when compared to the comparative example.

A manufacturing method of an OLED display according to another exemplary embodiment will now be described with reference to the accompanying drawings.

Figure 3:
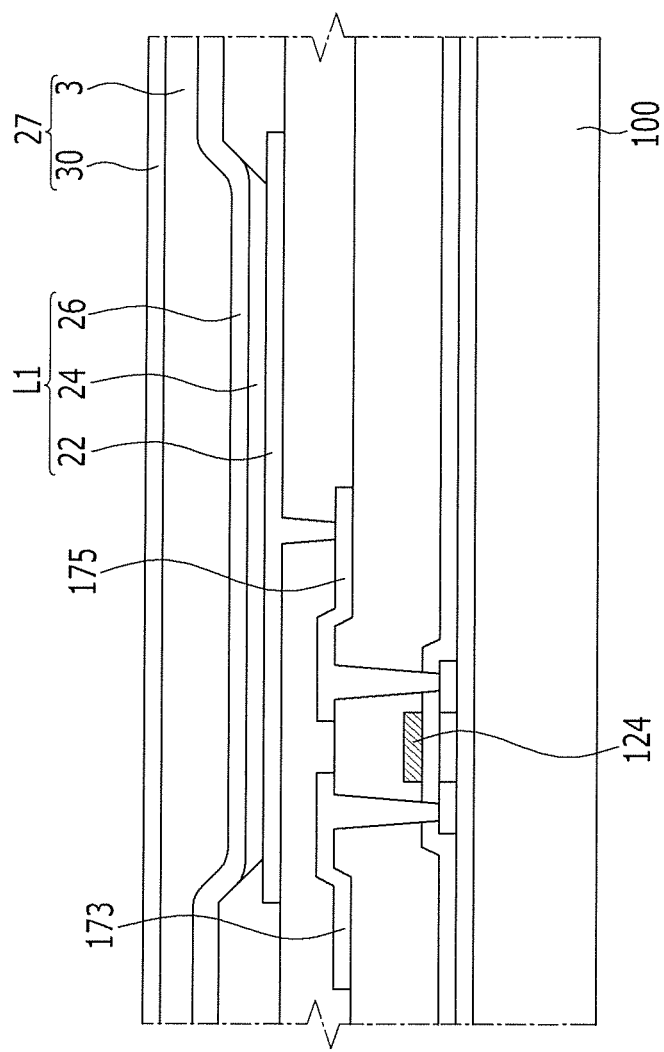
FIG. 3 shows a process for forming a covering layer of the OLED display according to an exemplary embodiment.
Figure 4:
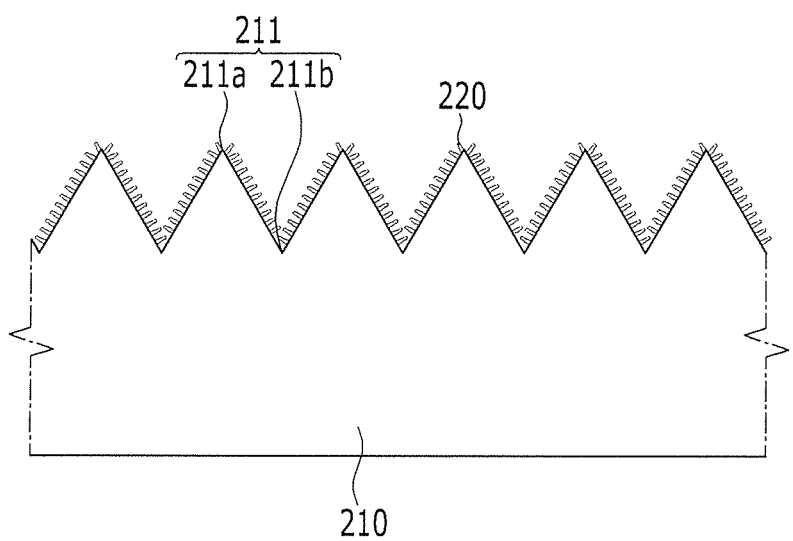
FIG. 4 and FIG. 5 sequentially show a manufacturing process of a patterned metal sheet.
Figure 5:
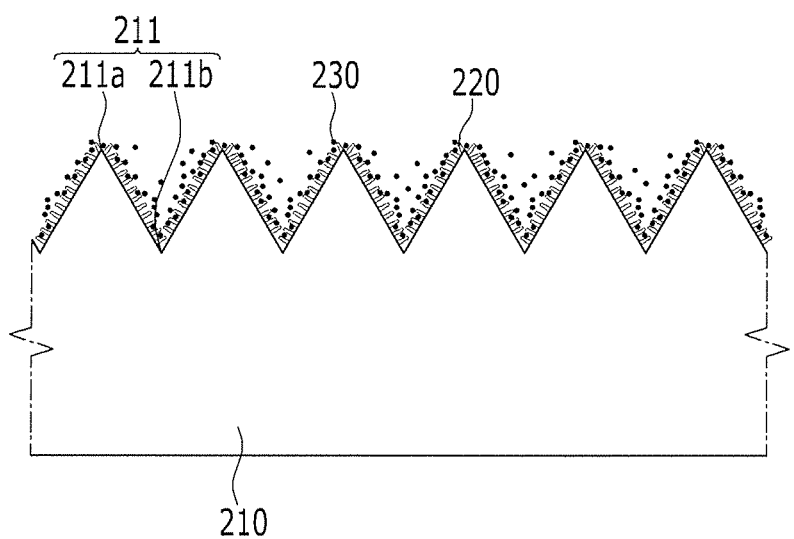
Figure 6:
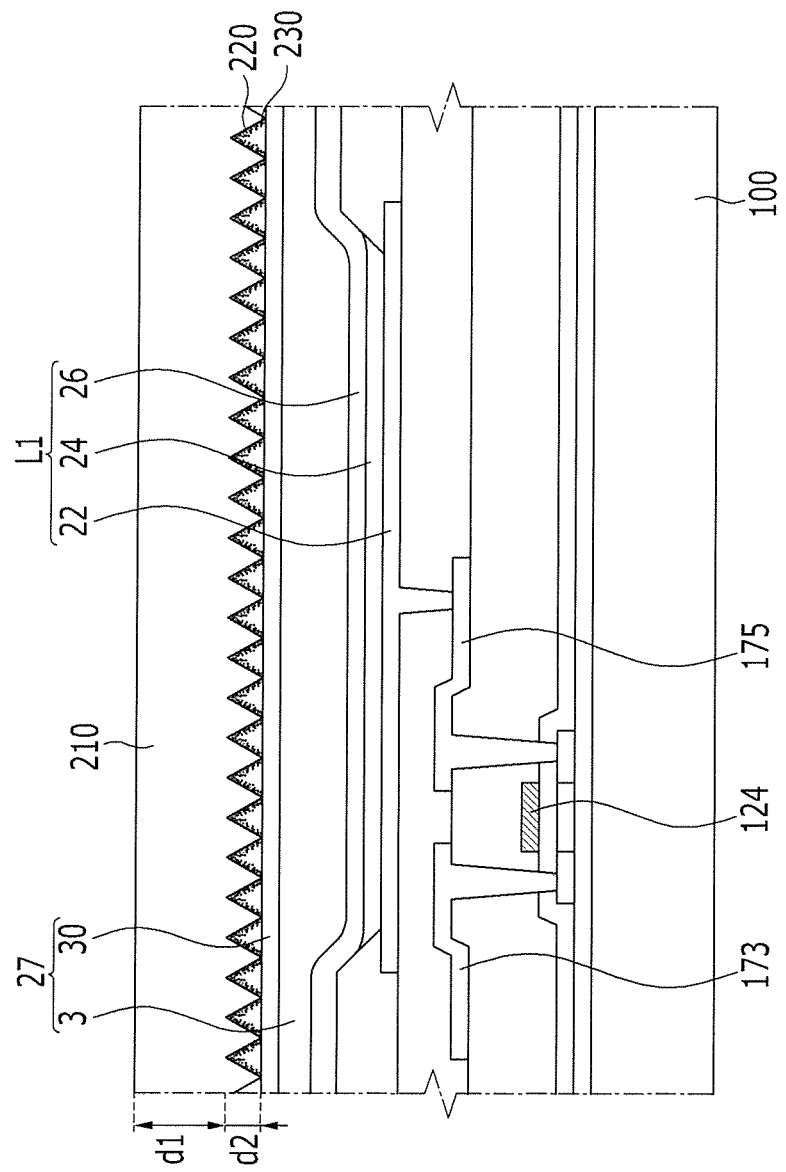
FIG. 6 shows a process for attaching the patterned metal sheet on the covering layer.

FIG. 3 shows a process for forming a covering layer of the OLED display according to an exemplary embodiment, FIG. 4 and FIG. 5 sequentially show a process of manufacturing a patterned metal sheet, and FIG. 6 shows a process for attaching the patterned metal sheet on the covering layer.

First, as shown in FIG. 3, the organic light emitting diode L1 is formed on the substrate 100. Then, the organic layer 3 is formed on the organic light emitting diode L1, and the adhesive layer 30 is formed by sequentially layering the first filling adhesive layer 31, the moisture-absorbing adhesive layer 32, and the second filling adhesive layer 33 on the organic layer 3 such that the overcoat 27 is completed.

The compositions for the first filling adhesive layer 31, the moisture-absorbing adhesive layer 32, and the second filling adhesive layer 33 are respectively coated to a film and then dried to form a sheet. The adhesive layer 30 may be manufactured by layering the sheets. A method for manufacturing the adhesive layer 30 is not restrictive, and any method known to a person in the art can be used. When the desired characteristic can be realized by forming the sheet, the sheet may be formed as a non-cured gel or a solid phase, or may be manufactured as a liquid phase and then post-processed. A layering method for forming an adhesive layer by respectively layering the manufactured moisture-absorbing adhesive sheets and filling adhesive sheets may be performed according to a method known to a person in the art, and the method is not restrictive. For example, the adhesive layer 30 may be manufactured by sequentially layering a moisture-absorbing sheet, a filling adhesive sheet, and a moisture-adhesive sheet using one selected from a roll-to-roll process, a roll-to-glass process, a press process, and a diaphragm process such that each sheet can form a moisture-absorbing layer or a filling adhesive layer.

Next, as shown in FIG. 4, the patterned metal sheet 210 is formed by forming the protrusion and depression portions 211 in the metal sheet. In addition, the protrusions 220 are formed at the surface of the patterned metal sheet 210 by performing surface-treatment on the patterned metal sheet 210. As described, the patterned metal sheet 210 having the protrusion and depression portions 211 is manufactured so that the patterned metal sheet 210 has many more protrusions 220 on the bottom surface of the patterned metal sheet 210. Accordingly, an area where the patterned metal sheet 210 contacts the adhesive layer 30 of the overcoat 27 is increased, thereby improving adhesion of the overcoat 27 and the patterned metal sheet 210.

Next, as shown in FIG. 5, the patterned metal sheet 210 is completed by attaching the silicon oxide particles 230 to the protrusion and depression portions 211. The silicon oxide particles 230 improve the hydrogen bonding force between the protrusion and depression portions 211 and the adhesive layer 30 of the overcoat 27 and decreases external stress.

Next, as shown in FIG. 6, the patterned metal sheet 210 is attached on the overcoat 27. A method for attaching the patterned metal sheet 210 on the overcoat 27 is not limited to a specific method, and for example, a lamination process, a press process, or a diaphragm process may be used.

As described, the adhesion between the overcoat 27 and the patterned metal sheet 210 can be improved by attaching a plurality of protrusions 220 and silicon oxide particles 230 on the patterned metal sheet 210. Accordingly, the life-span of the organic light emitting diode can be improved by completely blocking the permeation of external moisture.

Next, as shown in FIG. 1, the organic sheet 240 is attached on the upper surface of the protrusion and depression portions 211 of the patterned metal sheet 210. In addition, the flat metal sheet 250 is attached to the upper surface of the organic sheet 240. In order to improve the encapsulation characteristic, the thin film encapsulation layer 200 is completed by performing an iterative process for alternately layering the organic sheet 240 and the flat metal sheet 250.

While this disclosure has been described in connection with certain exemplary embodiments, it is understood that the various modification and changes can be made to the described embodiments without departing from the spirit and scope of the present invention, as defined in the appended claims.

What is claimed is:

1. An organic light emitting diode (OLED) display comprising:
   a substrate;
   an organic light emitting diode on the substrate; and
   a thin film encapsulation layer comprising:
      an overcoat covering the organic light emitting diode;
      a patterned metal sheet on the overcoat and comprising a pattern defined by a plurality of protrusion and depression portions;
      a plurality of secondary protrusions on a first surface of the pattern such that the plurality of secondary protrusions faces the overcoat;
      an organic sheet having a first surface attached to a second surface of the pattern; and
      a flat metal sheet attached to a second surface of the organic sheet.

2. The OLED display of claim 1, wherein the protrusion and depression portions have alternating convex portions and recess portions.

3. The OLED display of claim 2, wherein a height of each of the convex portions of the protrusion and depression portions is about 10% to about 100% of the thickness of the patterned metal sheet.

4. The OLED display of claim 1, further comprising silicon oxide particles on the first surface of the pattern such that the silicon oxide particles face the overcoat.

5. The OLED display of claim 4, wherein a ratio of the silicon oxide particles with respect to the secondary protrusions is about 1 wt % to about 20 wt %.

6. The OLED display of claim 4, wherein the patterned metal sheet and the secondary protrusions are formed of the same material.

7. The OLED display of claim 1, wherein the organic sheet comprises a plurality of organic sheets, and the flat metal sheet comprises a plurality of flat metal sheets, wherein the plurality of organic sheets and the plurality of flat metal sheets are alternately layered.

8. The OLED display of claim 1, wherein the overcoat and the organic sheet each comprises an organic layer, and an adhesive layer formed on the organic layer.

9. The OLED display of claim 8, wherein the adhesive layer comprises sequential layers of a first filling adhesive layer, a moisture-absorbing layer, and a second filling adhesive layer.

10. The OLED display of claim 9, wherein the moisture-absorbing layer comprises at least one moisture-absorbing material selected from the group consisting of silica gel ($SiO_2 \circ H_2O$), alumino-silicate beads, montmorillonite, zeolite ($Na_{12}AlO_3SiO_2 \circ 12H_2O$), activated carbon, alkali metal oxides, alkaline earth metal oxides, metal sulfates, metal halides, and metal perchlorates.

11. The OLED display of claim 9, wherein the first filling adhesive layer and the second filling adhesive layer are the same or different from each other, and each of the first filling adhesive layer and the second filling adhesive layer comprises at least one filling material selected from the group consisting of talc, silica, magnesium oxide, mica, montmorillonite, alumina, graphite, beryllium oxide, aluminum nitride, silicon carbide, mullite, and silicon.

12. The OLED display of claim 9, wherein the adhesive layer comprises a thermosetting resin or a photo-curable resin, and each of the first filling adhesive layer, the moisture-absorbing layer, and the second filling adhesive layer comprises a homogeneous thermosetting resin or a photo-curable resin such that the first filling adhesive layer, the moisture-absorbing layer, and the second filling adhesive layer are formed as one sheet without an interlayer interface therebetween.

* * * * *